United States Patent
Choi (10) Patent No.: US 7,775,222 B2
(45) Date of Patent: Aug. 17, 2010

(54) SINGLE SUBSTRATE CLEANING APPARATUS AND METHOD FOR CLEANING BACKSIDE OF SUBSTRATE

(75) Inventor: Chung-Sic Choi, Seoul (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 12/287,517

(22) Filed: Oct. 10, 2008

(65) Prior Publication Data
US 2009/0095328 A1    Apr. 16, 2009

(30) Foreign Application Priority Data
Oct. 11, 2007   (KR)   ................ 10-2007-0102485

(51) Int. Cl.
*B08B 3/00* (2006.01)
(52) U.S. Cl. .............. 134/137; 134/165; 134/902; 414/758; 414/941
(58) Field of Classification Search ............ 134/137, 134/140, 165, 902; 414/758, 783, 935, 941
See application file for complete search history.

(56) References Cited

U.S. PATENT DOCUMENTS

| | | | | |
|---|---|---|---|---|
| 5,498,294 A | * | 3/1996 | Matsushita et al. | 134/6 |
| 6,874,515 B2 | * | 4/2005 | Ishihara et al. | 134/140 |

FOREIGN PATENT DOCUMENTS

| | | | |
|---|---|---|---|
| JP | 2005175036 A | | 6/2005 |
| KR | 10-203-0027295 A | | 4/2003 |
| KR | 10-2007-0093746 A | | 9/2007 |
| KR | 2007093746 A | * | 9/2007 |
| KR | 1020070093746 A | | 9/2007 |

OTHER PUBLICATIONS

Machine Translation: KR 10-2007-0093746 A to Kim. Sep. 2007.*

* cited by examiner

*Primary Examiner*—Michael Kornakov
*Assistant Examiner*—Naomi Birbach
(74) *Attorney, Agent, or Firm*—Jenkins, Wilson, Taylor & Hunt, P.A.

(57) ABSTRACT

Provided are a single substrate cleaning apparatus, and a method for cleaning the backside of a substrate, where a substrate reversing device for cleaning the backside of a substrate is installed inside a processing chamber.

11 Claims, 13 Drawing Sheets

SINGLE SUBSTRATE CLEANING APPARATUS AND METHOD FOR CLEANING BACKSIDE OF SUBSTRATE

CROSS-REFERENCE TO RELATED APPLICATION

This U.S. non-provisional patent application claims priority under 35 U.S.C. §119 of Korean Patent Application No. 10-2007-0102485, filed on Oct. 11, 2007, the entire contents of which are hereby incorporated by reference.

BACKGROUND OF THE INVENTIVE CONCEPT

The present inventive concept disclosed herein relates to a substrate processing apparatus and method, and more particularly, to an apparatus for cleaning the backside of a substrate using single substrate cleaning and a method for cleaning the backside of a substrate.

In semiconductor device manufacturing, the front surface of a substrate (semiconductor substrate, LCD, etc.) is first cleaned, after which the substrate is subjected to intricate processing. Thus, before various manufacturing processes, or between processes, a cleaning process that removes impurities residing on the surface of the substrate is required. For example, in a photolithography process, before a photoresist is applied, brush cleaning in a spin scrubber is performed on the front surface of the substrate.

A well-known cleaning method involves using a robot (conveyor robot) to clamp a substrate and introduce the substrate into a cleaning apparatus for cleaning and remove the substrate from the cleaning apparatus once cleaning is completed. Also, it is common practice today to not only clean the front surface (also referred to as a device forming surface or an upper surface), but also the backside, so that a substrate reversing device must be used to reverse the substrate to clean the surface opposite to the front surface (or the backside) of the substrate, after which the substrate is cleaned.

SUMMARY OF THE INVENTIVE CONCEPT

The present inventive concept provides a single substrate cleaning apparatus and a method for cleaning the backside of a substrate that are capable of reducing costs through simplification of the substrate backside cleaning apparatus and processing steps, and minimizing contamination of a substrate from particles that can be generated during substrate conveyance.

Objects of the present inventive concept are not limited hereto, and other objects that are not specifically mentioned herein will become apparent to those skilled in the art from the description that follows.

Embodiments of the present inventive concept provide apparatuses for single substrate cleaning, including: a processing chamber in which a substrate cleaning process is performed; a substrate supporting member installed inside the processing chamber, on which a substrate for processing is placed; and a substrate reversing device installed to one side of the substrate supporting member inside the processing chamber, wherein the substrate reversing device includes a holding unit for holding the substrate, a reversing unit for reversing the holding unit, and an elevating unit for vertically moving the reversing unit.

In some embodiments, the holding unit may include: gripping members disposed above the substrate supporting member and moving in mutually opposite directions along a rotational axis about which the substrate is reversed to chuck/unchuck the substrate; and a driving member for driving the gripping members.

In other embodiments, the gripping members may include: a first gripping member for chucking an edge of the substrate toward the reversing unit; and a second gripping member for chucking an edge of the substrate opposite the reversing unit.

In still other embodiments, the driving member may include: a base; a first rod installed on an upper surface of the base to be capable of moving along the rotational axis, and connected to the first gripping member; a second rod installed on an undersurface of the base to be capable of moving along the rotational axis, and connected to the second gripping member; a cylinder linearly reciprocating one of the first and second rods; and a power transmitting member for transmitting a driving force of the cylinder such that the other of the first and second rods is moved in a direction opposite to the one of the first and second rods.

In even other embodiments, the cylinder may be installed on the upper surface of the base to linearly reciprocate the first rod.

In yet other embodiments, the power transmitting member may include: a first and second pulley installed through the upper surface and the undersurface of the base; a belt wound around the first and second pulleys; and a first and second connecting member connecting the first and second rods to the belt, respectively.

In further embodiments, the first gripping member may include: at least one first gripper; and a first bracket with the first gripper installed thereon, and connected to the first rod.

In still further embodiments, the second gripping member may include: at least two second grippers; and a second bracket with the second grippers installed thereon, and connected to the second rod.

In even further embodiments, the holding unit may further include a supporting member on which the substrate to be chucked/unchucked with the first and second gripping members is placed.

In yet further embodiments, the supporting member may include: an annular supporting ring; and a plurality of supporting pins installed on the supporting ring to support the substrate.

In other embodiments, the second bracket may be disposed below the substrate supported by the supporting pins of the supporting member.

In still other embodiments, the second bracket may be disposed at the same height as the supporting ring of the supporting member.

In other embodiments of the present inventive concept, methods for cleaning a backside of a substrate, include: loading a substrate introduced into a chamber onto a substrate supporting member through reversing the substrate using a substrate reversing device installed inside the chamber; and removing the substrate from the chamber after a backside of the substrate has been cleaned, through unloading the substrate from the substrate supporting member and reversing the substrate.

In other embodiments, the substrate reversing device may chuck/unchuck the substrate through moving gripping members in opposite directions along a rotational axis about which the substrate is reversed.

In still other embodiments, the gripping members may be moved in the opposite directions by one driving member to chuck/unchuck the substrate.

In even other embodiments, the gripping members may move vertically above the substrate supporting member.

In yet other embodiments, the substrate reversing device may move up the substrate, reversing the substrate to load the substrate on the substrate supporting member, and move up the substrate, reversing the substrate to unload the substrate that has been cleaned from the substrate supporting member and elevates.

BRIEF DESCRIPTION OF THE FIGURES

The accompanying figures are included to provide a further understanding of the present inventive concept, and are incorporated in and constitute a part of this specification. The drawings illustrate exemplary embodiments of the present inventive concept and, together with the description, serve to explain principles of the present inventive concept. In the figures.

DETAILED DESCRIPTION OF PREFERRED EMBODIMENTS

Preferred embodiments of an apparatus for single substrate cleaning and a method for cleaning the backside of a substrate according to the present inventive concept will be described below in more detail with reference to the accompanying drawings. In the assigning of reference numerals to elements in the respective figures, when like elements are illustrated in different figures, like reference numerals are assigned to the like elements throughout wherever possible. Also, in the description of the present inventive concept, detailed descriptions of related and shared structures or functions will not be provided when it is believed that such descriptions will obscure the main focus of the present inventive concept.

First Embodiment

Figure 1:
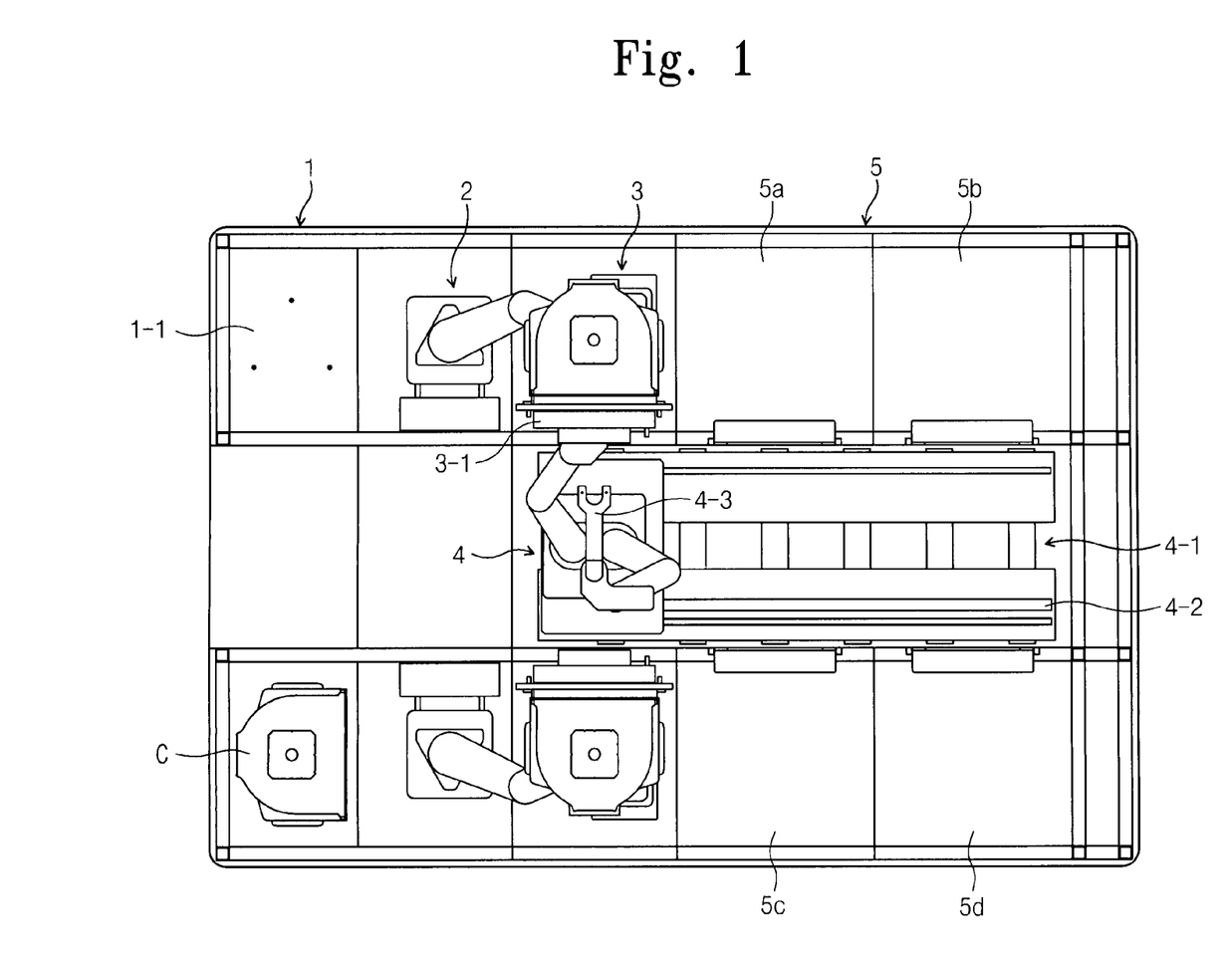
FIG. 1 is a view illustrating the configuration of a single substrate cleaning apparatus according to the present inventive concept.

FIG. 1 is a view illustrating the configuration of a single substrate cleaning apparatus according to the present inventive concept.

Referring to FIG. 1, a single substrate cleaning apparatus according to the present inventive concept is for cleaning the backside of a substrate, and includes a loading/unloading portion 1, a carrier transferring portion 2, a carrier table 3, a substrate transferring portion 4, and a cleaning processing portion 5.

The loading/unloading portion 1 has an in/out port 1-1 on which a carrier (C) accommodating substrates is placed. The carrier transferring portion 2 is disposed to be adjacent to the loading/unloading portion 1, and the substrate transferring portion 4 is disposed at the central portion on the other side of the carrier transferring portion 2. The substrate transferring portion 4 has a passage 4-1 formed perpendicularly to the carrier transferring portion 2, for a transfer robot 4-3. A transfer guide 4-2 is installed in a longitudinal direction inside the passage 4-1, and the transfer robot 4-3 is guided by the transfer guide 4-2 to move along the length of the passage 4-1. The carrier table 3 and the cleaning processing portion 5 are disposed on both sides of the passage 4-1. The cleaning processing portion 5 has a plurality of processing chambers 5a, 5b, 5c, and 5d uniformly arranged on both sides of the passage 4-1 of the substrate transferring portion 4. The substrate transferring portion 4, the carrier table 3, and the cleaning processing portion 5 may be configured in duplex structure of upper layer and lower layer stacks, and the carrier transferring portion 2 may have a duplex structure corresponding to the duplex structure of the carrier tables 3. Also, the carrier transferring portion 2, the carrier tables 3, the substrate transferring portion 4, and the cleaning processing portion 5 may be respectively provided with a fan filter unit (not shown) for supplying clean air at top portions thereof.

A airtight container such as a front open unified pod may be used as the carrier (C) for accommodating substrates. The carrier (C) is placed on the in/out port 1-1 of the loading/unloading portion 1 by means of a transferring member (not shown) such as an overhead transfer, an overhead conveyor, or an automatic guided vehicle. The carrier (C) placed on the in/out port 1-1 of the loading/unloading portion 1 is transferred by the carrier transferring portion 2 to the carrier table 3. A transfer robot 4-3 of the substrate transferring portion 4 transfers substrates to be cleaned from the carrier (C) placed on the carrier table 3 to the processing chambers 5a, 5b, 5c, and 5d of the substrate cleaning processing portion 5, and cleaning processing is performed on the substrates in the processing chambers 5a, 5b, 5c, and 5d. The substrates that have undergone cleaning processing in the cleaning processing portion 5 are transferred to the carrier (C) placed on the carrier table 3 by the transfer robot 4-3, and the carrier (C) accommodating the substrates that have undergone cleaning processing is placed on the in/out port 1-1 of the loading/unloading portion 1 by the transferring portion 2.

Figure 2:
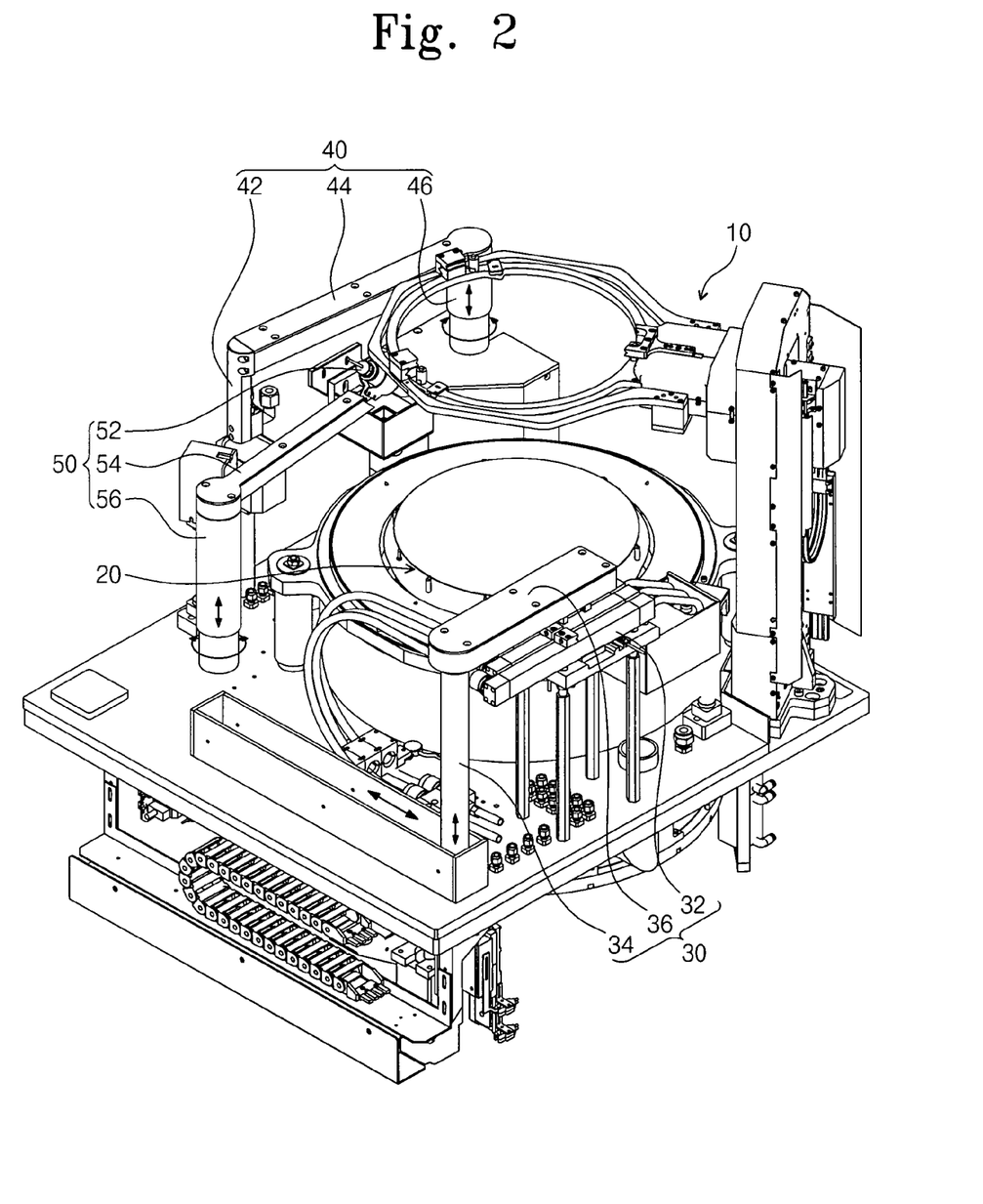
FIG. 2 is a perspective view illustrating the internal configuration of a processing chamber in FIG. 1.

FIG. 2 is a perspective view illustrating the internal configuration of a processing chamber in FIG. 1.

Referring to FIG. 2, a substrate supporting member 20, substrate cleaning members 30, 40, and 50, and a substrate (or wafer) reversing device 10 are provided inside a processing chamber. The substrate supporting member 20 supports wafers (W) during cleaning processing of the wafers, and may rotate while the processing is performed. The substrate reversing device 10 and the substrate cleaning members 30, 40, and 50 for cleaning substrates are disposed on the circumference of the substrate supporting member 20.

The substrate cleaning members 30, 40, and 50 include a first process fluid supplying member 30 supplying liquid chemicals to substrates, a second process fluid supplying member 40 supplying a rinsing fluid or a drying gas to substrates, and an ultrasonic cleaning member 50.

The first process fluid supplying member 30 supplies liquid chemicals to substrates by linearly reciprocating in a scanning method. The liquid chemicals used in cleaning processing of substrates may be at least one among hydrofluoric acid (HF), sulfuric acid ($H_2SO_4$), nitric acid ($HNO_3$), phosphoric acid ($H_3PO_4$), and an SC-1 solution (mixture of ammonium hydroxide ($NH_4OH$), hydrogen peroxide ($H_2O_2$), and water ($H_2O$)). The first process fluid supplying member 30 has at least one liquid chemical supply nozzle 32. And a liquid chemical supply nozzle 32, selected according to the type of liquid chemicals to be used in substrate processing supplies liquid chemical onto a substrate. The liquid chemical supply nozzle 32 is selected through the operation of a moving rod 34 and a pick-up member 36. The moving rod 34 installed vertically may be linearly reciprocated along a scanning direction by a driving portion (not shown), or may be moved upward and downward. Through vertical movement of the moving rod 34, the pick-up member 36, connected to the top end of the moving rod 34 and disposed horizontally, is moved vertically, and the pick-up member 36 picks up a selected liquid chemical supply nozzle 32. With a liquid chemical supply nozzle 32 picked up by the pick-up member 36, the moving rod 34 moves along a scanning direction, and the liquid chemical supply nozzle 32 supplies liquid chemical onto the substrate. Here, the substrate placed on the substrate supporting member 20 is rotated by rotation of the substrate supporting member 20.

The second process fluid supplying member 40 moves in a boom swing manner and supplies a rinsing fluid or drying gas onto a substrate. Deionized water (DIW) may be used as a rinsing fluid, and isopropyl alcohol (IPA) gas may be used as the drying gas. The second process fluid supplying member 40 has a nozzle 42 disposed vertically and supplying rinsing fluid or drying gas toward the substrate supporting member 20. The nozzle 42 is connected to one end of a nozzle support 44, and the nozzle support 44 is disposed horizontally to maintain perpendicularity to the nozzle 42. A moving rod 46 is coupled to the other end of the nozzle support 44 and disposed vertically to maintain perpendicularity to the nozzle support 44, and moves the nozzle 42 during processing or before and after processing. Also, the moving rod 46 is connected to a driving portion (not shown). The driving portion (not shown) may be a motor for rotating the nozzle 42, or may selectively be an assembly for linearly moving the nozzle 42 up and down.

The ultrasonic cleaning member 50 has an ultrasonic oscillator 52 that applies ultrasonic vibrations to liquid chemicals supplied on a substrate (W). The ultrasonic oscillator 52 is connected to one end of a support 54 that is horizontally disposed. A moving rod 56 is coupled to the other end of the support 54 to maintain a perpendicular disposition with respect to the support 54, in order to move the ultrasonic oscillator 52 during processing or before and after processing. The moving rod 56 is also connected to a driving portion (not shown). The driving portion (not shown) may be a motor for rotating the ultrasonic oscillator 52, or may selectively be an assembly for linearly moving the ultrasonic oscillator 52 up and down. The liquid chemical supplied onto a substrate removes or thins impurities from a substrate, and here, the ultrasonic cleaning member 50 is used, and ultrasonic vibrations are applied to the liquid chemical. The liquid chemical to which ultrasonic vibrations are applied trigger a chemical reaction in impurities on the substrate (W) to increase removal efficiency of the impurities on the substrate (W).

Figure 3:
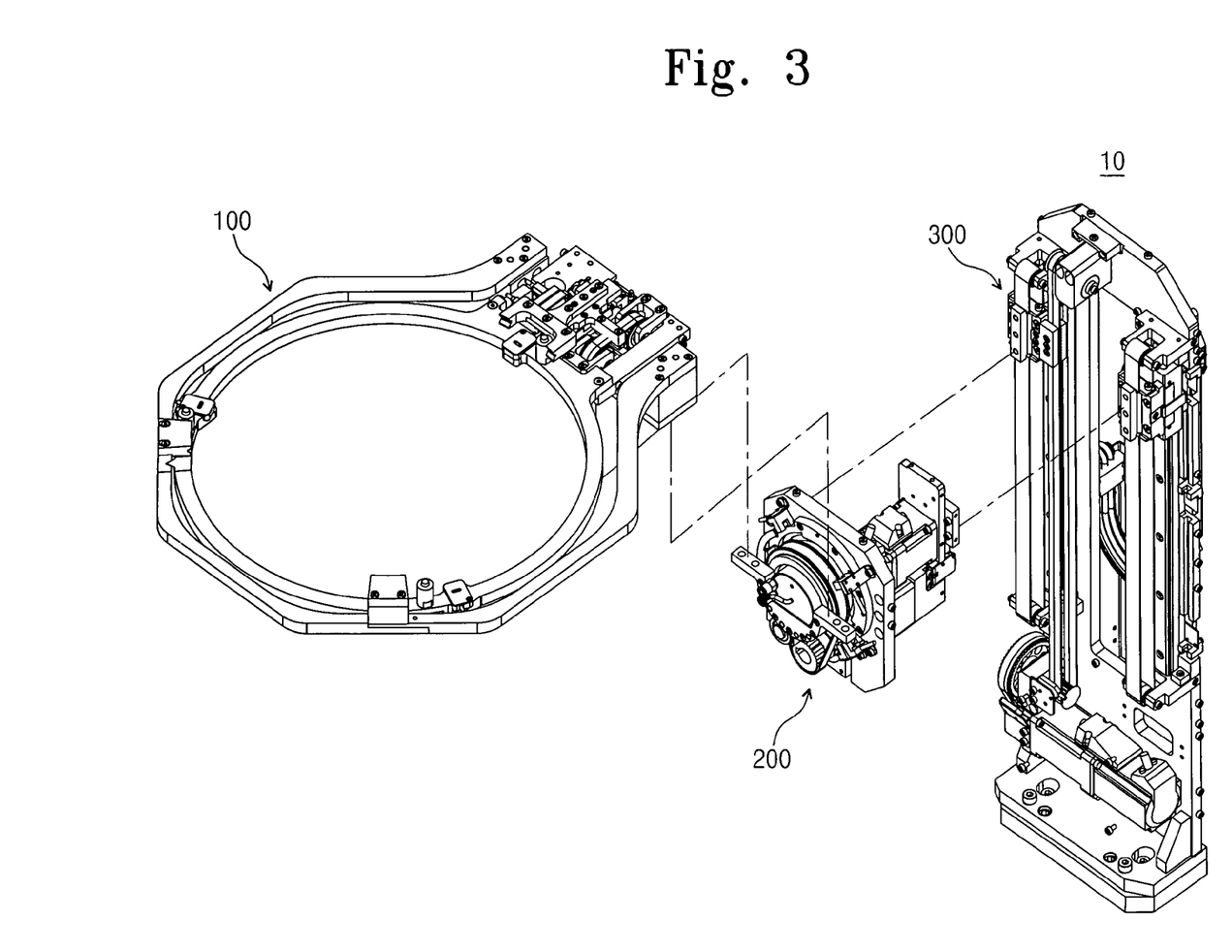
FIG. 3 is an exploded perspective view of a substrate reversing device in FIG. 2.

FIG. 3 is an exploded perspective view of a substrate reversing device in FIG. 2.

Referring to FIG. 3, a substrate reversing device includes a holding unit 100, a reversing unit 200, and an elevating unit 300. The holding unit 100 holds a substrate. The reversing unit 200 reverses the holding unit 100 by 180° to reverse the substrate held by the holding unit 100. The elevating unit 300 moves the reversing unit 200 upward and downward to load/unload the substrate held by the holding unit 100 to and from the substrate supporting member (reference number 20 in FIG. 2).

Figure 4:
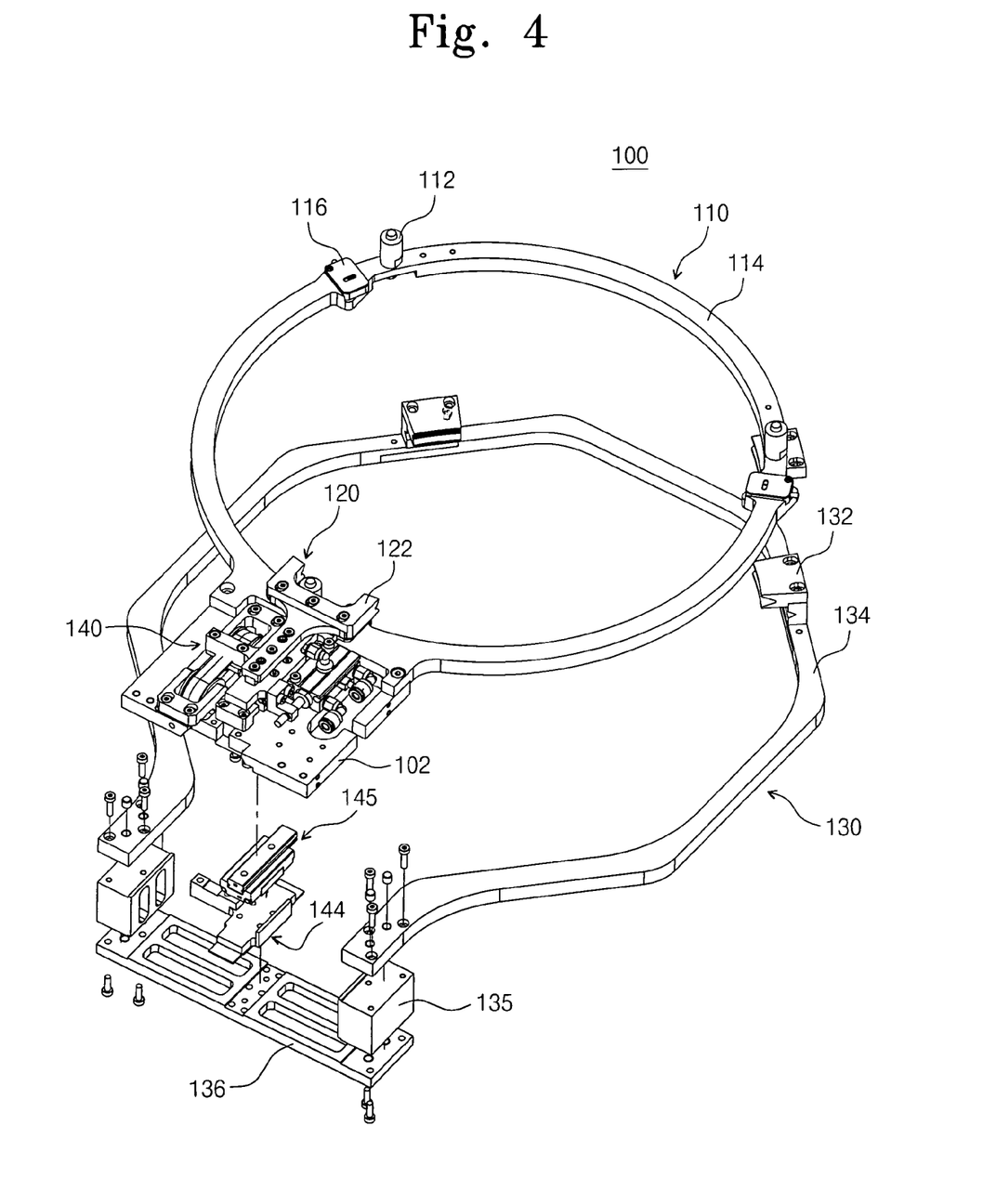
FIG. 4 is an exploded perspective view of a holding unit in FIG. 3.
Figure 5:
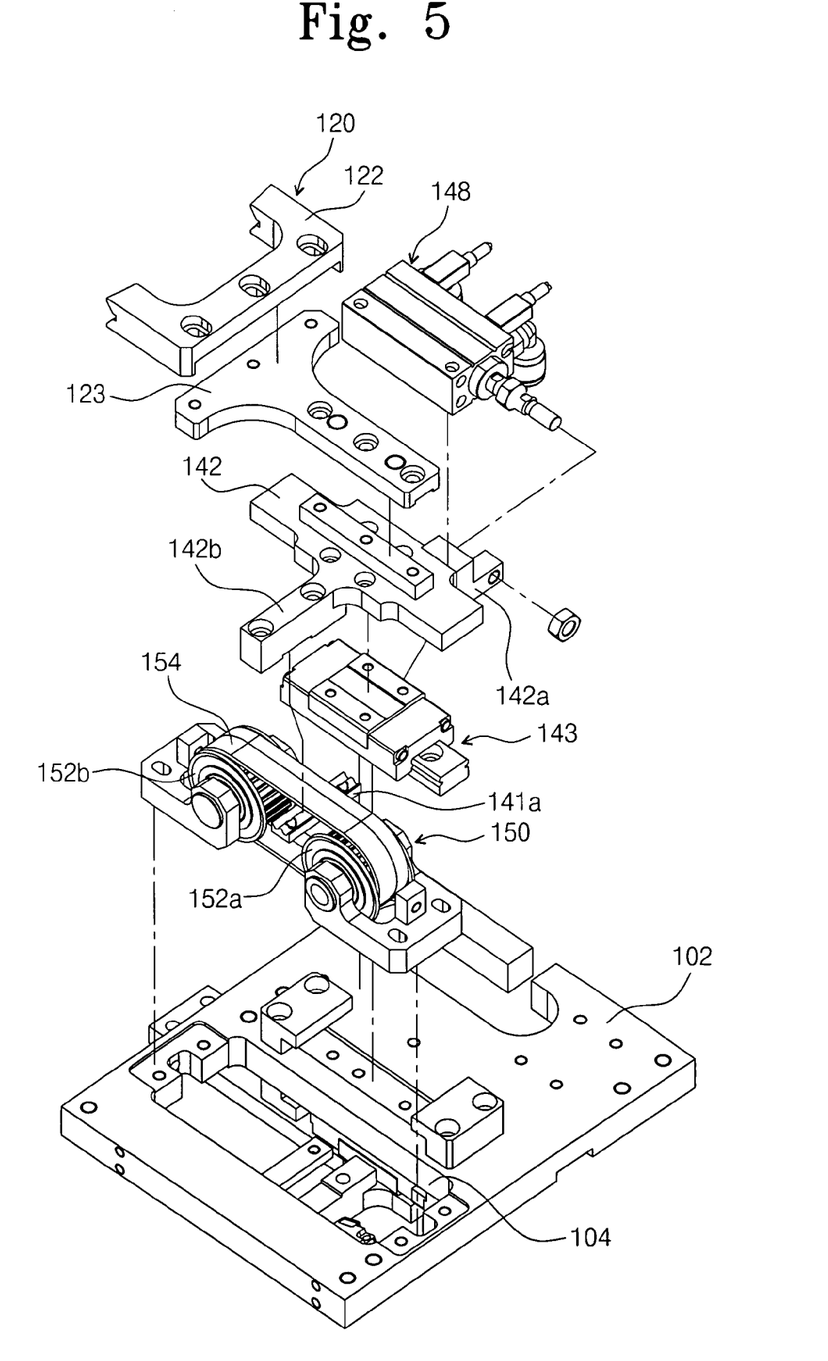
FIGS. 5 and 6 are exploded perspective views of a driving member in FIG. 4.
Figure 6:
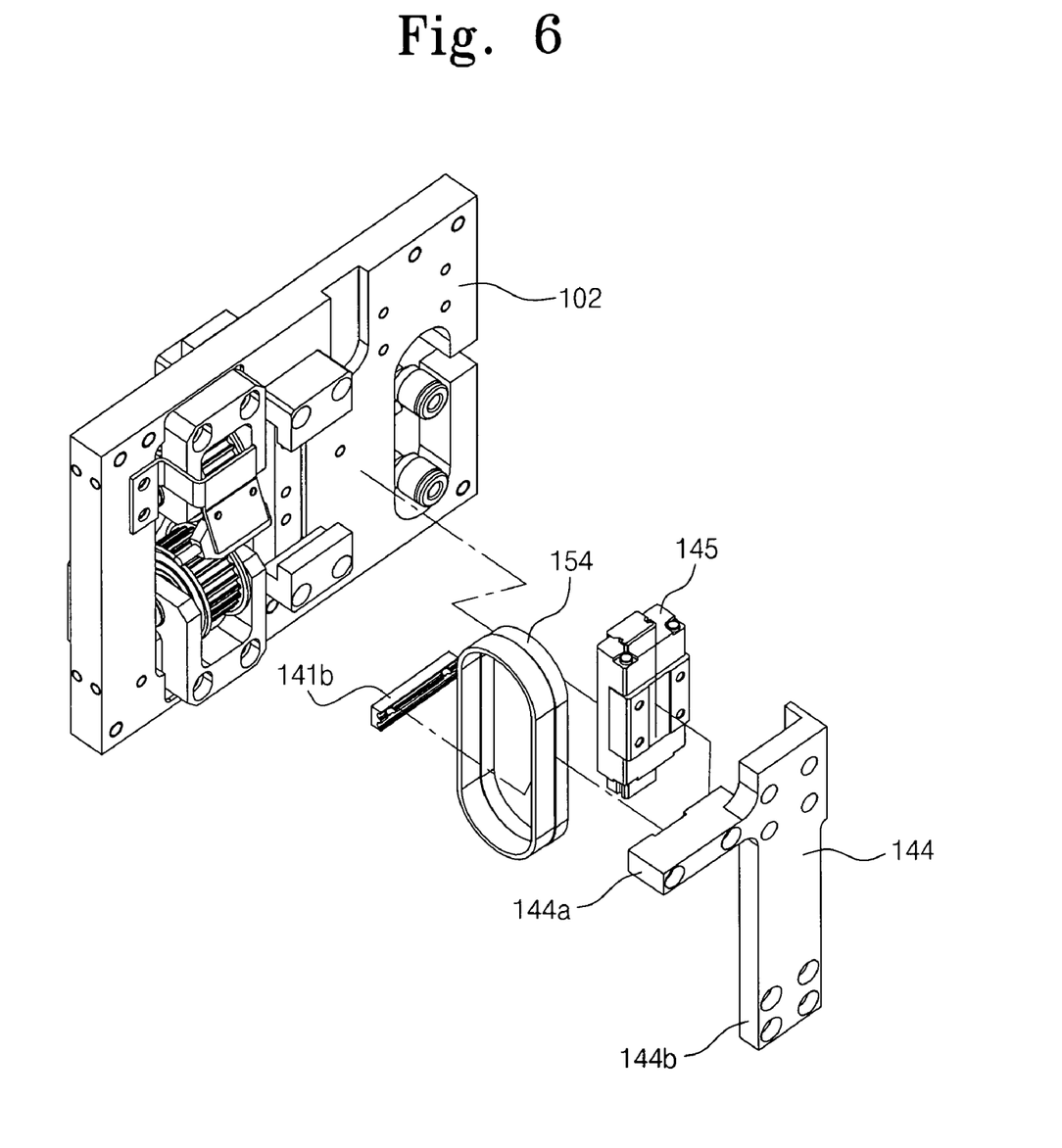

FIG. 4 is an exploded perspective view of a holding unit in FIG. 3, and FIGS. 5 and 6 are exploded perspective views of a driving member in FIG. 4.

Referring to FIGS. 4 through 6, a holding unit 100 includes a supporting member 110, a first gripping member 120, a second gripping member 130, and a driving member 140.

The supporting member 110, as a portion on which a substrate to be reversed or a substrate that has been reversed is placed, is formed of a supporting ring 114 provided with a plurality of supporting pins 112 upon which the perimeter of a substrate is placed to prevent the substrate from moving. The supporting ring 114 is fixedly installed on a base 102. The supporting ring 114 may have a radius that is equal to or less than the radius of a substrate. A detecting sensor 116 is installed on the supporting ring 114, and the detecting sensor 116 detects the perimeter of a substrate placed on the supporting ring 114 to check whether the substrate is properly positioned on the supporting ring 114.

The first gripping member 120 and the second gripping member 130 are portions for holding (gripping) a substrate placed on the supporting pins 112 of the supporting ring 114 when the holding unit 100 is being reversed. The first gripping member 120 is disposed toward the reversing unit 200 along the rotational axis in which a substrate is reversed, and the second gripping member 130 is disposed on the opposite side of the reversing unit 200. Thus, in the present inventive concept, because the first and second gripping members 120 and 130 that chuck a substrate are respectively installed in positions about the rotational axis in which a substrate is reversed, when the holding unit 100 is rotated, spatial restrictions are not imposed by a required rotating radius. Accordingly, the substrate reversing device 10 according to the present inventive concept is suitable for use in cleaning equipment that requires a space with a low ceiling.

The first gripping member 130 has a first gripper 122 formed in a " ⊃ " shape to be able to grip a substrate at two points, and the first gripper 122 is connected to the first rod 142 through a "T"-shaped connecting block 123 coupled beneath the first gripper 122.

The driving member 140 includes the first rod 142, a second rod 144, a cylinder 148, and a power transmitting member 150. The first rod 142 is installed on the upper surface of the base 102. Specifically, the first rod 142 is installed on a first guide block 143 installed on an upper surface of the base 102 to move forward and rearward along the substrate rotation axis (S). A connecting block 123 connected to the first gripper 122 is installed on the first rod 142. The first rod 142 includes a first portion 142a connected to a cylinder 148 to receive linear motive force, and a second portion 142b connected to a belt 154 of a driving force transmitting member 150 to receive linear motive force. The second portion 142b is connected by the first connecting member 141a to the belt 154. The first rod 142 is connected to the cylinder 148 to be moved forward and rearward according to the operation of the cylinder 148, and the first rod 142 is connected to the belt 154 of the power transmitting member 150, so that the linear driving force of the cylinder 148 is transmitted to the power transmitting member 150.

The second rod 144 is installed on the undersurface of the base 102. Specifically, the second rod 144 is installed on a second guide block 145 installed on the undersurface of the base 102, to be moved forward and rearward along the rotational axis of the substrate, as with the first rod 142. The second rod 144 includes a first portion 144a connected to the belt 154 of the power transmitting member 150 through the second connecting member 141b, and a second portion 144b connected to the second gripping member 130. The first portion 144a receives linear driving force from the power transmitting member 150, and the second portion 144b provides linear driving force to the second gripping portion 130.

The power transmitting member 150 is installed in a through portion 104 defined in the base 102. The power transmitting member 150 transmits the linear driving force of the cylinder 148 in the opposite direction to the second rod 144. The power transmitting member 150 includes a pair of pulleys 152a and 152b, and a belt 154 wound around the pulleys 152a and 152b. The first rod 142 is connected to a upper portion of the belt 154 positioned above the upper surface of the base 102, and the second rod 144 is connected to a lower portion of the belt 154 positioned beneath the lower surface of the base 102. Thus, the first rod 142 and the second rod 144 are moved in opposite directions by the belt 154.

The second gripping member 130 includes two second grippers 132 and a second bracket 134. The second bracket 134 is shaped like a horseshoe, and the two grippers 132 are installed on the second bracket 134 opposite to the second rod 144. The second bracket 134 is disposed below the substrate. That is, the second bracket 134 is disposed at the same height as the supporting ring 114 to the outside of the supporting ring 114. If the second bracket 134 is disposed at the same height as the supporting ring 114, when the transfer robot 4-3 of the substrate transferring portion (reference numeral 4 in FIG. 1) loads or unloads a substrate onto or off of the supporting pins 112 of the supporting ring 114, interference with the transfer robot 4-3 may be avoided. Also, one side of the second bracket 134 is open. The two ends of the second bracket 134 that form the open portion are coupled to a connecting block 135, respectively, and the connecting blocks 135 are connected through a plate 136. The second portion 144b of the second rod 144 is coupled on the plate 136, to enable the second gripping member 130 to be moved forward and rearward along the rotational axis about which a substrate is reversed, according to linear movement of the second rod 144 along the rotational axis.

Figure 7A:
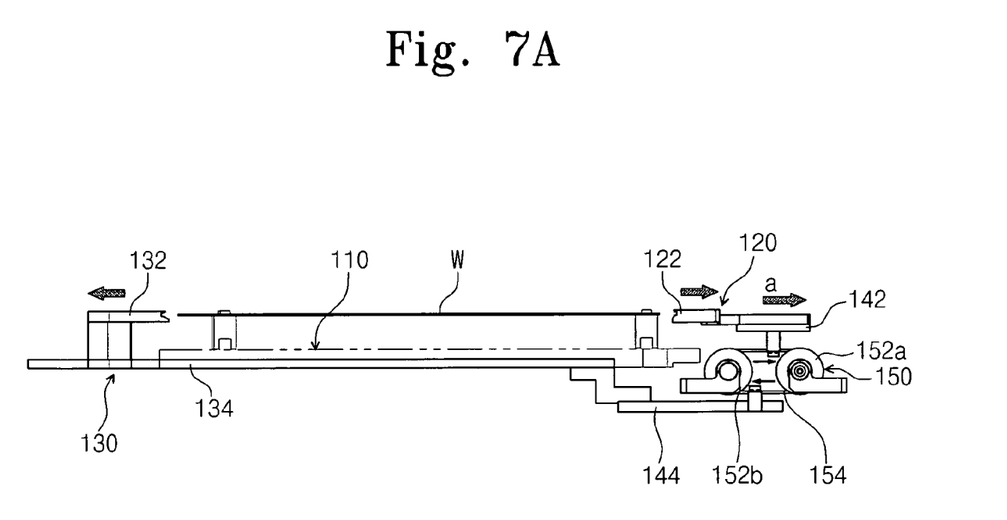
FIGS. 7A and 7B are views illustrating the operation of a holding unit.
Figure 7B:
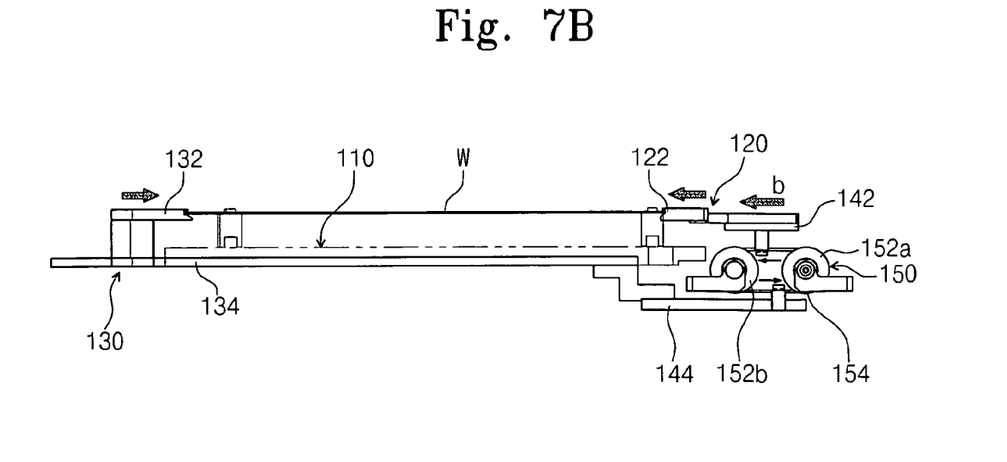

FIGS. 7A and 7B are views illustrating the operation of a holding unit 100. For the sake of convenience in describing the operation of the first and second gripping members 120 and 130, the supporting member and the base are not illustrated in FIGS. 7A and 7B, and elements not illustrated will be described using their reference numerals from FIGS. 4 through 6.

When the cylinder 148 moves in direction (a), the first rod 142 and the first gripping member 120 are moved in direction (a), and the second rod 144 and the second gripping member 130 are moved in the opposite direction (b). That is, when the cylinder 148 moves in direction (a), the first gripping member 120 and the second gripping member 130 move from the edge of a substrate to unchucking positions (in FIG. 7A). Conversely, when the cylinder moves in direction (b), the first rod 142 and the first gripping member 120 move in direction (b), and the second rod 144 and the second gripping member 130 move in direction (a) opposite to direction (b). That is, when the cylinder 148 moves in direction (b), the first gripping member 120 and the second gripping member 130 move to chucking positions (in FIG. 7B) to hold the substrate at its edge.

Thus, the holding unit 100 of the present inventive concept does not use a motor to chuck/unchuck a substrate, but has a power transmitting member 150 that uses one cylinder 148 to linearly move the first gripping member 120 and the second gripping member 130 in mutually opposite directions to chuck/unchuck a substrate.

Also, by not using a motor, the present inventive concept does not require complex controlling for a motor, but instead requires a simple I/O (on/off) control, so that product manufacturing cost may be reduced and operating malfunctions may be reduced as well.

Also, because in the present inventive concept, the first gripping member 120 and the second gripping member 130 are moving in mutually opposite directions along rotational axis of a substrate to chuck a substrate at either side edge thereof, the apparatus may be used in cleaning equipment requiring a holding unit 100 with a small rotating radius and a space with a low ceiling.

Figure 8:
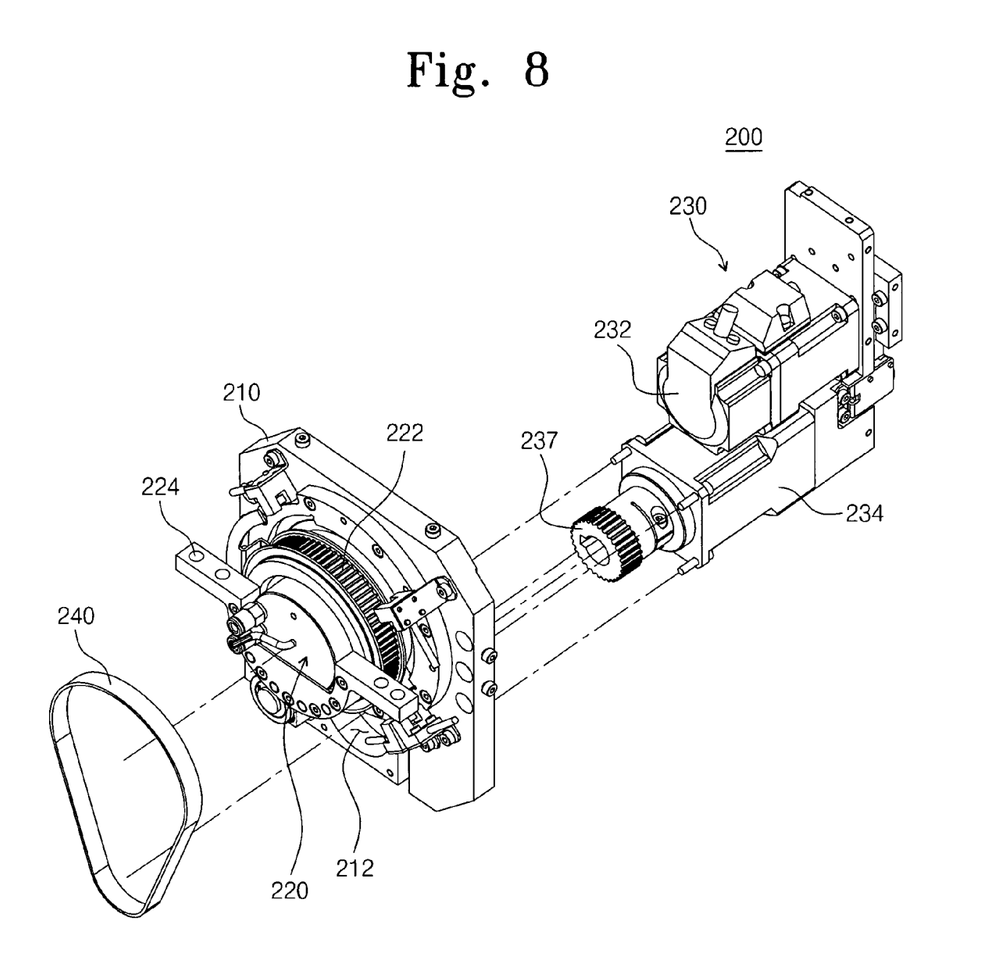
FIG. 8 is an exploded perspective view of the reversing unit in FIG. 3.
Figure 9:
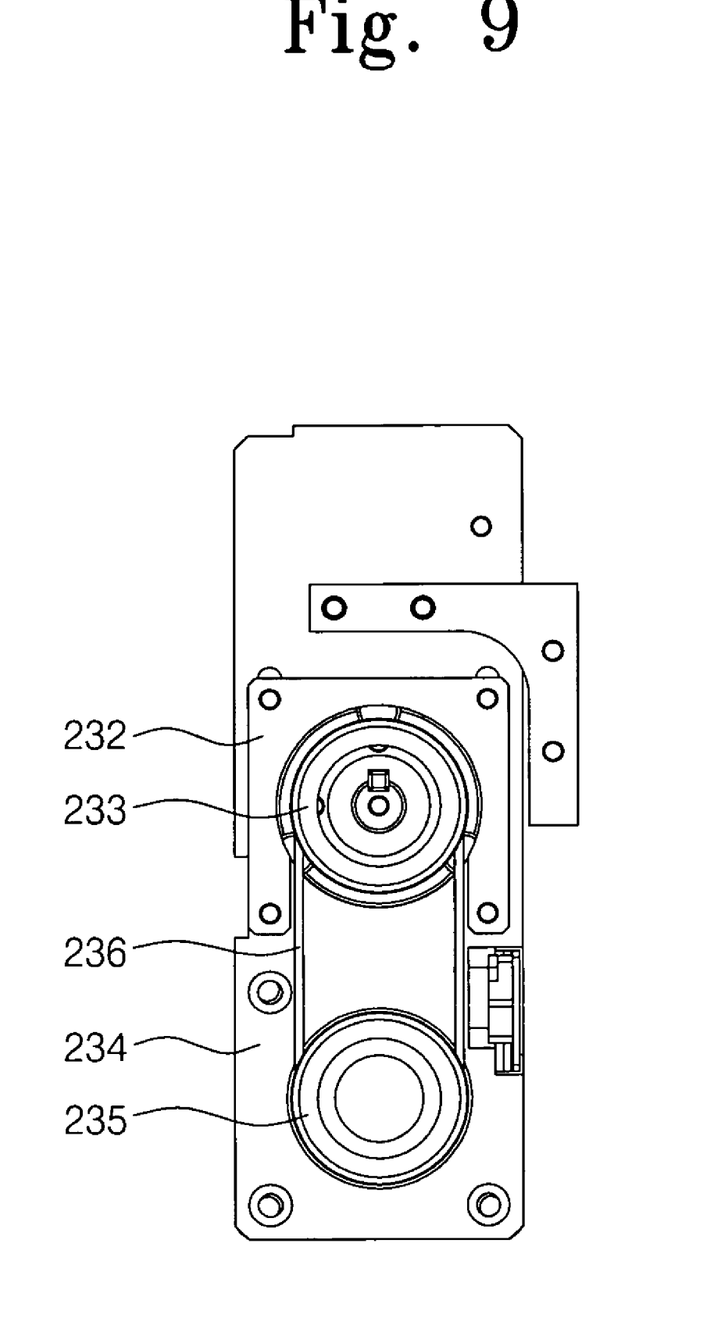
FIG. 9 is a rear view of a driving member in FIG. 8.

FIG. 8 is an exploded perspective view of the reversing unit in FIG. 3, and FIG. 9 is a rear view of a driving member in FIG. 8.

Referring to FIGS. 8 and 9, a reversing unit 200 for reversing a holding unit 100 includes a rotating shaft member 220 and a driving member 230. The rotating shaft member 220 has the holding unit 100 coupled thereto, and the driving member 230 imparts rotating force to the rotating shaft member 220 to reverse the holding unit 100.

The rotating shaft member 220 is rotatably supported on a supporting block 210, and a pulley 222 wound around the perimeter of the rotating shaft member 220 is provided to the rotating shaft member 220. The pulley 222 rotates together with the rotating shaft member 220 by means of the rotating force from the driving member 230. Also, a bracket 224 is coupled to the free end of the rotating shaft member 220, and a base 102 of the holding unit 100 is connected to the bracket 224.

The driving member 230 has a driving motor 232 and a power transmitting member 234 that transmits driving force from the driving motor 232. The driving motor 232 and the power transmitting member 234 are disposed to be parallel, as illustrated in FIG. 8. The output end of the driving motor 232 and the input end of the power transmitting member 234 are respectively provided with a pulley 233 and 235, and a belt 236 is wound around the pulleys 233 and 235. Also, a pulley 237 is provided on the output end of the power transmitting member 234, and the driving member 230 is inserted and installed in a hole 212 defined in the bottom of the supporting block 210, such that the pulley 237 is connected by the belt 240 to the pulley 222 provided around the rotating shaft member 220.

Figure 10:
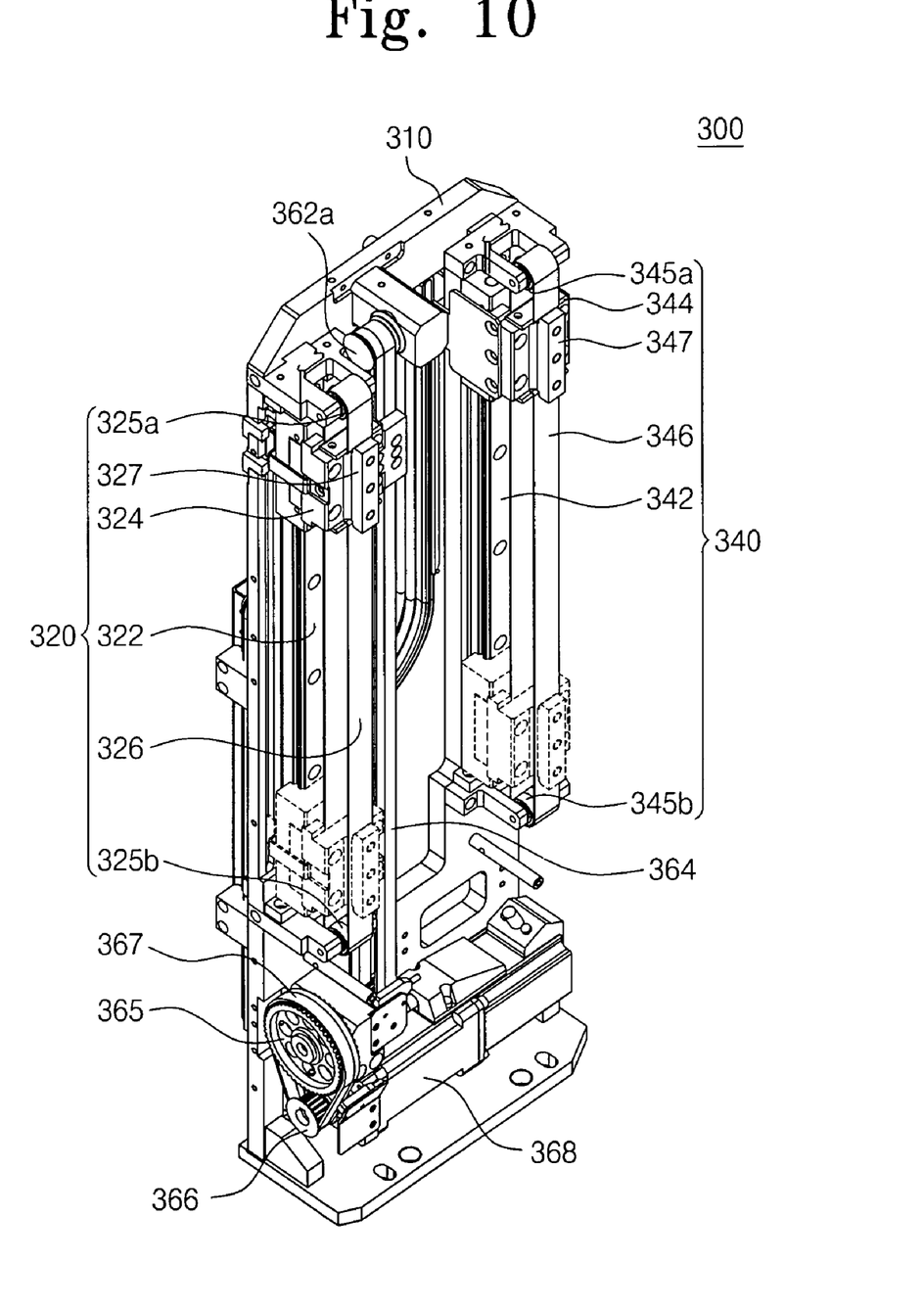
FIGS. 10 and 11 are a perspective view and a frontal view of an elevating unit in FIG. 3.
Figure 11:
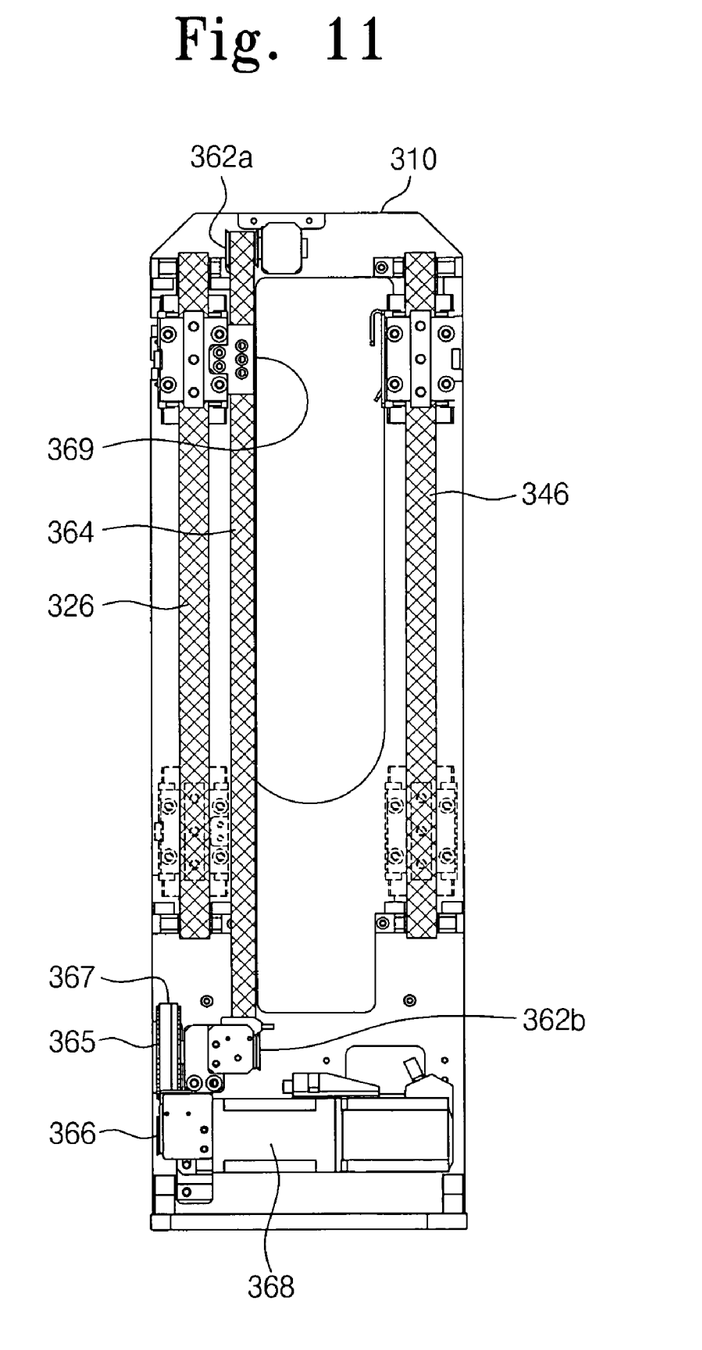

FIGS. 10 and 11 are a perspective view and a frontal view of an elevating unit 300 in FIG. 3.

The elevating unit 300 includes a frame 310, and a first and second guide member 320 and 340 installed on the frame 310. The first and second guide member 320 and 340 are disposed symmetrically at either side along the lengthwise direction of the frame 310. Guide rails 322 and 342 are installed on both left and right sides of the frame 310 along the lengthwise direction of the frame 310, and sliders 324 and 344 are mounted to be capable of sliding on the guide rails 322 and 342. Pulleys 325a and 325b are provided at the top and bottom of the guide rail 322, and pulleys 345a and 345b are provided at the top and bottom of the guide rail 342. The pulleys 325a and 325b are connected via a belt 326, and the pulleys 345a and 345b are connected via a belt 346. Also, the sliders 324 and 344 are connected to the belts 326 and 346 to link the driving of the belts 326 and 346 to the vertical movement of the sliders 324 and 344. That is, with connecting members 327 and 347 contacting the outer surfaces of the belts 326 and 346, and the sliders 324 and 344 contacting the inner surfaces of the belts 326 and 346, the connecting members 327 and 347 are coupled to the sliders 324 and 344 to press against the belts 326 and 346. In this configuration, the belts 326 and 346 are driven in the moving direction of the sliders 324 and 344 according to vertical movement of the sliders 324 and 344.

A belt 364 is provided parallel and in proximity to the belt 326 of the first guide member 320 on the frame 310, and the belt 364 is wound around the pulleys 362a and 362b. The bottom pulley 362b of the pulleys 362a and 362b is driven by a driving motor 368, and the rotating force of the driving motor 368 is transmitted to the pulley 362b via the assembly of the belt 367 and the pulleys 365 and 366. Also, a connecting member 369, to which the supporting block 210 of the reversing unit 200 is connected, is coupled to the belt 364.

Figure 12A:
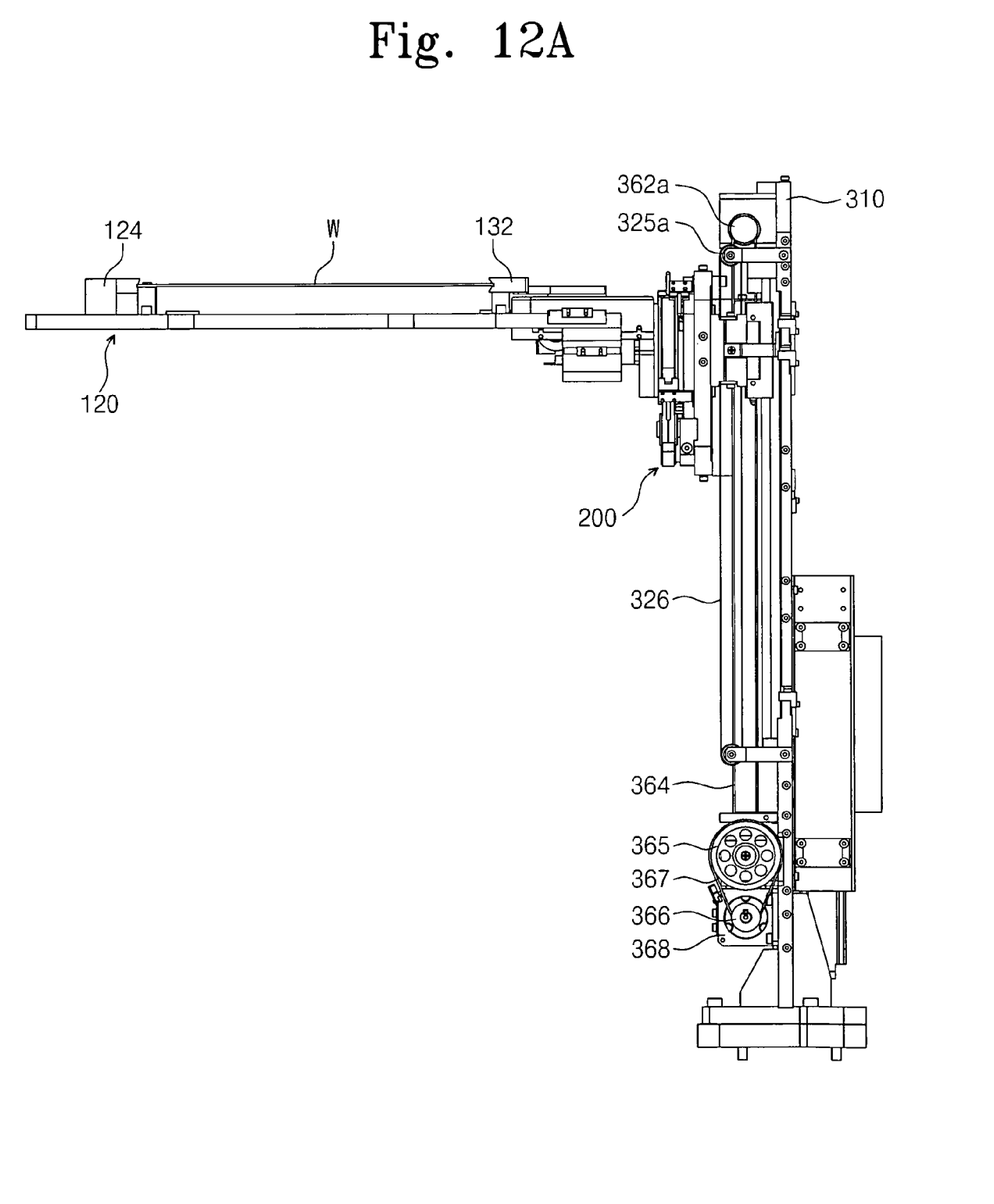
FIGS. 12A and 12B are views illustrating the operation of a reversing unit and an elevating unit.
Figure 12B:
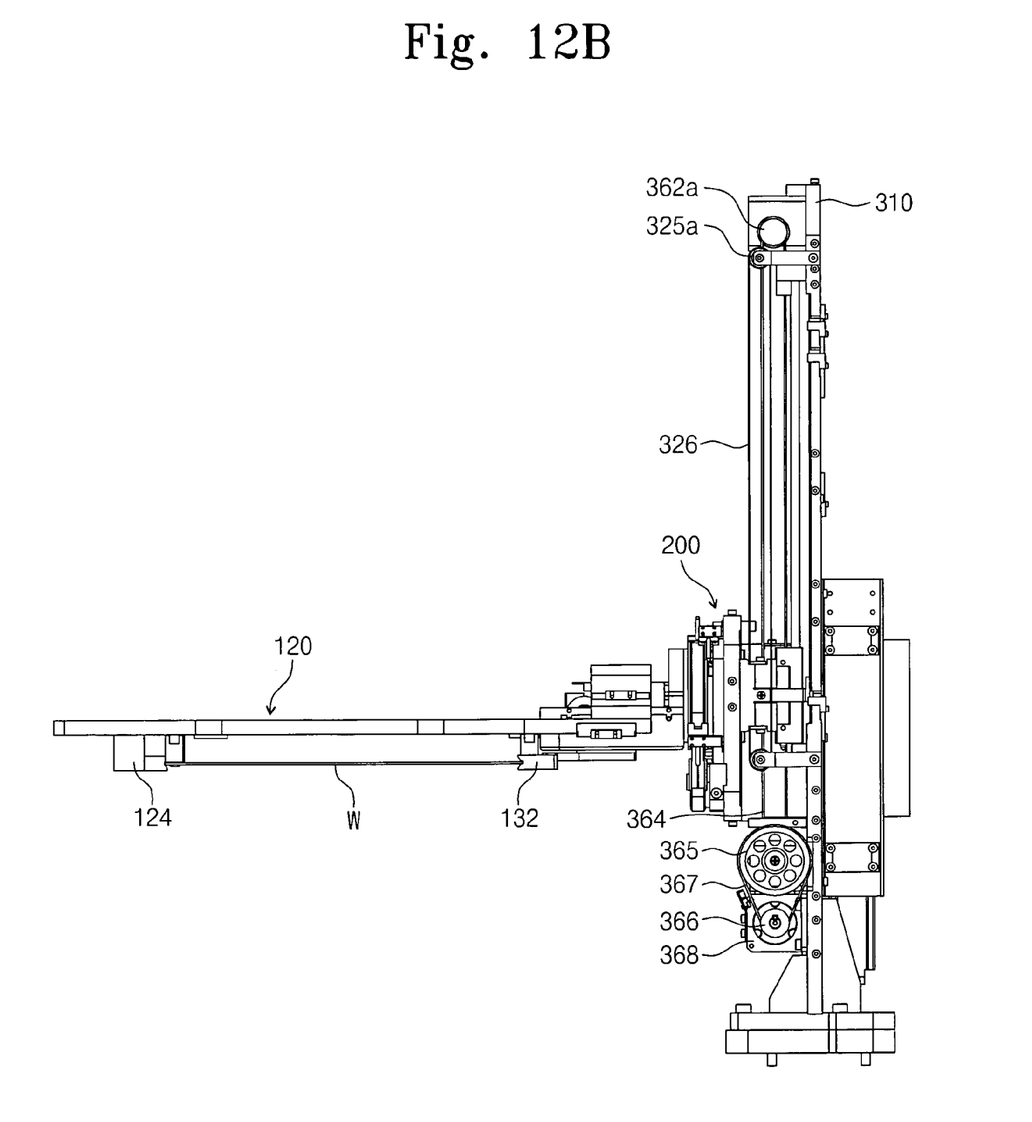

The supporting block 210 of the reversing unit 200 is connected to the connecting members 327, 347, and 369 connected to the belts 326, 346, and 364, respectively. The rotating force of the driving motor 368 is transmitted to the belt 364, and the supporting block 210 connected to the belt 364 is moved up and down. Here, because the left and right sides of the supporting block 210 are connected to the belts 326 and 346 of the first and second guide members 320 and 340 through the connecting members 327 and 347, the supporting block 210 can retain balance when moving vertically. Also, because the sliders 324 and 344 are connected to the belts 326 and 346, the vertical movement of the supporting block 210 is guided by the guide rails 322 and 342. Through this operation, the elevating unit 300 moves the reversing unit 200 vertically. Further, as described above, because the base 102 of the holding unit 100 is connected to the bracket 224 of the reversing unit 200, the holding unit 100 moves vertically in concert with the reversing unit 200, as illustrated in FIGS. 12A and 12B. The reversing unit 200 may be moved vertically by the elevating unit 300 with the holding unit 100 reversed, or the reversing unit 200 may be moved vertically by the elevating unit 300 while the holding unit 100 is being reversed. These states may be achieved by operating the driving motor 232 of the reversing unit 200 and the driving motor 368 of the elevating unit 300 in sequence or through synchronous control.

As described above, because the substrate reversing device 10 for cleaning the backside of a substrate according to the present inventive concept is disposed inside a processing chamber, the following advantages can be realized.

First, when compared to a conventional substrate backside cleaning apparatus with a separate substrate reversing unit provided outside the processing chamber, because the present inventive concept does not require a separately installed space for a substrate reversing unit, equipment cost can be reduced, and maintenance costs may also be reduced.

Second, through simplification of processing steps, the present inventive concept may increase process efficiency.

Third, the present inventive concept may minimize contamination of substrates from particles generated during transferring of the substrates.

The above-disclosed subject matter is to be considered illustrative, and not restrictive, and it will be apparent to those with ordinary skill in the art that various revisions and modifications are included in the present inventive concept, insofar as they do not depart from the spirit and scope of the present inventive concept. In accordance, the embodiments disclosed in the present inventive concept are intended to describe and not to restrict the technical scope of the present inventive concept, and therefore, the technical scope of the present inventive concept shall not be interpreted as being restricted in any way by the foregoing embodiments. Thus, to the maximum extent allowed by law, the scope of the present inventive concept is to be determined by the broadest permissible interpretation of the following claims and their equivalents, and shall not be restricted or limited by the foregoing detailed description.

What is claimed is:

1. An apparatus for single substrate cleaning, comprising:
a processing chamber for performing a substrate cleaning process;
a substrate supporting member installed inside the processing chamber for placement of a substrate for processing; and
a substrate reversing device disposed adjacent to the substrate supporting member inside the processing chamber,
wherein the substrate reversing device comprises
a holding unit for holding the substrate,
a reversing unit for reversing the holding unit, and
an elevating unit for vertically moving the reversing unit; and
wherein the holding unit comprises:
two or more gripping members for gripping the substrate and disposed above the substrate supporting member, the gripping members comprising a first gripping member disposed toward the reversing unit and a second gripping member disposed opposite the reversing unit, the first gripping member and the second gripping member being movable in mutually opposite directions along a rotational axis about which the substrate is reversible for chucking/unchucking the substrate; and
a driving member for driving the first gripping member and the second gripping member.

2. The apparatus of claim 1, wherein the driving member comprises:
a base;
a first rod installed on an upper surface of the base to be capable of moving along the rotational axis, and connected to the first gripping member;
a second rod installed on an undersurface of the base to be capable of moving along the rotational axis, and connected to the second gripping member;
a cylinder linearly reciprocating one of the first and second rods; and
a power transmitting member for transmitting a driving force of the cylinder such that the other of the first and second rods is moved in a direction opposite to the one of the first and second rods.

3. The apparatus of claim 2, wherein the cylinder is installed on the upper surface of the base to linearly reciprocate the first rod.

4. The apparatus of claim 2, wherein the power transmitting member comprises:
a first and second pulley installed through the upper surface and the undersurface of the base;
a belt wound around the first and second pulleys; and
a first and second connecting member connecting the first and second rods to the belt, respectively.

5. The apparatus of claim 4, wherein the first gripping member comprises:
at least one first gripper; and
a first bracket with the first gripper installed thereon, and connected to the first rod.

6. The apparatus of claim 5, wherein the second gripping member comprises:
at least two second grippers; and
a second bracket with the second grippers installed thereon, and connected to the second rod.

7. The apparatus of claim 6, wherein the holding unit further comprises a holding support member on which the substrate to be chucked/unchucked with the first and second gripping members is placed.

8. The apparatus of claim 7, wherein the holding support member comprises:
   an annular supporting ring; and
   a plurality of supporting pins installed on the supporting ring to support the substrate.

9. The apparatus of claim 8, wherein the second bracket is disposed below the substrate supported by the supporting pins of the holding support member.

10. The apparatus of claim 9, wherein the second bracket is disposed at the same height as the supporting ring of the holding support member.

11. The apparatus of claim 8, wherein the second bracket is horseshoe shaped and has a radius that is greater than a radius of the annular supporting ring.

* * * * *